(12) United States Patent
Yoshida

(10) Patent No.: US 12,415,302 B2
(45) Date of Patent: Sep. 16, 2025

(54) CONVEYING APPARATUS, RESIN MOLDING APPARATUS, CONVEYING METHOD, AND RESIN MOLDED PRODUCT MANUFACTURING METHOD

(71) Applicant: TOWA CORPORATION, Kyoto (JP)

(72) Inventor: Syuhei Yoshida, Kyoto (JP)

(73) Assignee: TOWA CORPORATION (JP)

( * ) Notice: Subject to any disclaimer, the term of this patent is extended or adjusted under 35 U.S.C. 154(b) by 419 days.

(21) Appl. No.: 17/286,653

(22) PCT Filed: Aug. 1, 2019

(86) PCT No.: PCT/JP2019/030369
§ 371 (c)(1),
(2) Date: Apr. 19, 2021

(87) PCT Pub. No.: WO2020/079923
PCT Pub. Date: Apr. 23, 2020

(65) Prior Publication Data
US 2021/0370565 A1    Dec. 2, 2021

(30) Foreign Application Priority Data

Oct. 19, 2018 (JP) .................................. 2018-197518

(51) Int. Cl.
*B29C 45/00* (2006.01)
*B21D 39/00* (2006.01)
(Continued)

(52) U.S. Cl.
CPC .......... *B29C 45/4225* (2013.01); *B29C 43/02* (2013.01); *B29C 43/50* (2013.01);
(Continued)

(58) Field of Classification Search
CPC ...... B29C 43/50; B29C 45/4225; B29C 43/02
See application file for complete search history.

(56) References Cited

U.S. PATENT DOCUMENTS

| | | | |
|---|---|---|---|
| 5,603,879 A * | 2/1997 | Osada | ..................... B29C 45/34 264/102 |
| 5,753,538 A * | 5/1998 | Kuno | ................ B29C 45/14655 264/272.17 |

(Continued)

FOREIGN PATENT DOCUMENTS

| | | | | |
|---|---|---|---|---|
| CN | 104112679 A | 10/2014 | | |
| EP | 4541547 A1 * | 4/2025 | ............. | B29C 33/44 |

(Continued)

OTHER PUBLICATIONS

JPH10335360A (Kishi) May 1997 (online machine translation), [Retrieved on Jun. 8, 2023]. Retrieved from: Espacenet (Year: 1997).*

(Continued)

*Primary Examiner* — Alison L Hindenlang
*Assistant Examiner* — Andres E. Behrens, Jr.
(74) *Attorney, Agent, or Firm* — Brooks Kushman P.C.

(57) ABSTRACT

The present invention is a transfer device for unloading a resin molded article from one mold provided with a resin injection unit, the resin molded article being unloaded by the transfer device from one mold provided with a resin injection unit having a member projecting between at least part of the resin molded article and another mold, wherein the resin injection unit has a member projecting between at least part of the resin molded article and the other mold, and the transfer device is equipped with a holding member for holding the resin molded article and a horizontal movement mechanism that causes the holding member holding the resin molded article to move in the horizontal direction to separate the resin molded article from the resin injection unit.

7 Claims, 12 Drawing Sheets

(51) Int. Cl.
  *B21D 39/20* (2006.01)
  *B29C 37/00* (2006.01)
  *B29C 43/00* (2006.01)
  *B29C 43/02* (2006.01)
  *B29C 43/50* (2006.01)
  *B29C 44/00* (2006.01)
  *B29C 44/20* (2006.01)
  *B29C 45/02* (2006.01)
  *B29C 45/42* (2006.01)
  *B29L 31/34* (2006.01)

(52) U.S. Cl.
  CPC ...... *B29C 45/02* (2013.01); *B29C 2043/5046* (2013.01); *B29L 2031/3425* (2013.01)

(56) References Cited

U.S. PATENT DOCUMENTS

| | | | | |
|---|---|---|---|---|
| 5,846,477 | A * | 12/1998 | Hotta | B29C 45/14655 264/272.17 |
| 5,885,506 | A * | 3/1999 | Bolanos | B29C 45/463 264/328.5 |
| 6,048,483 | A * | 4/2000 | Miyajima | H01L 21/566 264/272.17 |
| 6,439,869 | B1 * | 8/2002 | Seng | B29C 45/14655 264/272.17 |
| 2002/0056942 | A1 * | 5/2002 | Seng | B29C 45/02 264/272.17 |
| 2004/0063234 | A1 * | 4/2004 | Takase | H01L 24/97 438/26 |
| 2006/0131780 | A1 * | 6/2006 | Kuno | B29C 41/42 425/444 |
| 2009/0304843 | A1 * | 12/2009 | Steiner | B29C 45/0003 425/595 |
| 2012/0175812 | A1 * | 7/2012 | Ikeda | H01L 21/565 425/129.1 |
| 2016/0001901 | A1 * | 1/2016 | Takamatsu | B29C 45/7626 53/111 R |
| 2018/0117813 | A1 * | 5/2018 | Ho | B29C 45/1701 |
| 2021/0107186 | A1 * | 4/2021 | Endoh | B29C 51/42 |
| 2021/0387385 | A1 * | 12/2021 | Yoshida | H01L 21/56 |
| 2022/0161475 | A1 * | 5/2022 | Okunishi | B29C 45/56 |
| 2024/0009900 | A1 * | 1/2024 | Yoshida | B29C 45/2602 |

FOREIGN PATENT DOCUMENTS

| | | | | |
|---|---|---|---|---|
| JP | 08-197567 | A | | 8/1996 |
| JP | H10335360 | A * | 5/1997 | ........... H01L 21/565 |
| JP | 10-335360 | A | | 12/1998 |
| JP | H10335360 | | * | 12/1998 |
| JP | H-11284002 | A * | 10/1999 | ............ B29C 45/38 |
| JP | 2001-217269 | A | | 8/2001 |
| JP | 2004-193582 | A | | 7/2004 |
| JP | 2014-212246 | A | | 11/2014 |
| JP | 2014212246 | | * | 11/2014 |
| JP | 2017121771 | A | | 7/2017 |
| JP | 2022039709 | A * | 3/2022 | ............ B29C 33/44 |
| KR | 20120028639 | A | | 3/2012 |
| TW | 201234502 | A | | 8/2012 |
| WO | WO-2018180409 | | * | 10/2018 |

OTHER PUBLICATIONS

JPH10335360 (Yuichi) Dec. 1998 (online machine translation), [Retrieved on Aug. 7, 2023]. Retrieved from: Espacenet (Year: 1998).*
JP2014212246 (Shinj) Nov. 2014 (online machine translation), [Retrieved on Aug. 7, 2023]. Retrieved from: Espacenet (Year: 2014).*
WO-2018180409 (Katsuhisa) Oct. 4, 2018 (online machine translation), [Retrieved on Aug. 7, 2023]. Retrieved from: Espacenet (Year: 2018).*
JPH-11284002-A (Nakayama) Oct. 1999 (online machine translation), [Retrieved on May 22, 2025]. Retrieved from: Espacenet (Year :1999).*
JP-2022039709-A (Yoshida) Mar. 2022 (online machine translation), [Retrieved on May 22, 2025]. Retrieved from: Espacenet (Year: 2022).*
Office Action dated May 11, 2022 issued in CN patent application No. 201980068065.0, 12 pgs.
Office Action dated Sep. 3, 2019 issued for Japanese patent application No. 2018-197518, 12 pgs.
International Search Report dated Sep. 10, 2019 issued for International application No. PCT/JP2019/030369, 4 pgs.
Decision to grant a patent dated Jan. 9, 2020 issued for Japanese patent application No. 2018-197518t, 6 pgs.
Office Action dated Jan. 9, 2020 issued for Taiwan patent application No. 108132124, 9 pgs.
Decision of refusal dated Jun. 16, 2020 issued for Taiwan patent application No. 108132124, 5 pgs.

* cited by examiner

CROSS-SECTIONAL VIEW ACROSS A LINE A-A
(VERTICAL CAM MECHANISM)

CONVEYING APPARATUS, RESIN MOLDING APPARATUS, CONVEYING METHOD, AND RESIN MOLDED PRODUCT MANUFACTURING METHOD

CROSS-REFERENCE TO RELATED APPLICATIONS

This application is the U.S. national phase of PCT Application No. PCT/JP2019/030369, filed Aug. 1, 2019, which claims priority to Japanese Patent Application No. 2018-197518, filed Oct. 19, 2018, which are both incorporated by reference herein in their entireties.

TECHNICAL FIELD

The present invention relates to a conveying apparatus, a resin molding apparatus, a conveying method, and a resin molded product manufacturing method.

TECHNICAL BACKGROUND

Conventionally, as is shown, for example, in Patent Document 1, in a resin molding apparatus that includes a lower mold in which is formed a pot into which a resin material is placed, and an upper mold in which is formed a cavity into which the resin material placed in the pot is injected, a structure is employed in which a resin molded product is extracted by a conveying apparatus.

DOCUMENTS OF THE PRIOR ART

Patent Documents

[Patent Document 1] Japanese Unexamined Patent Application Laid-Open (JP-A) No. 2001-217269

DISCLOSURE OF THE INVENTION

Problems to be Solved by the Invention

However, in a conventional method in which a substrate that has been resin molded using this resin molding apparatus is lifted up from the lower mold and conveyed away, if, for example, a component from the lower mold is present between the substrate and the upper mold, then this component ends up coming into contact with the substrate and it may become difficult for the substrate to be conveyed away.

The present invention was conceived in order to solve the above-described drawbacks, and it is a principal object thereof to enable a resin molded product to be conveyed away by a conveying apparatus from one mold in which is provided a component that protrudes between at least a portion of the resin molded product and another mold.

Means for Solving the Problem

In other words, a conveying apparatus according to the present invention is a conveying apparatus that conveys a resin molded product away from one mold in which a resin injection portion is provided, and is characterized in that the resin injection portion is provided with a component that protrudes between at least a portion of the resin molded product and another mold, and in that the conveying apparatus is provided with a holding component that holds the resin molded product, and a horizontal movement mechanism that moves the holding component which is holding the resin molded product in a horizontal direction so as to move the holding component away from the resin injection portion.

Effects of the Invention

According to the present invention which is formed in this manner, a resin molded product is able to be conveyed away by a conveying apparatus from one mold in which is provided a resin injection portion which has a component that protrudes between at least a portion of the resin molded product and another mold.

DESCRIPTION OF THE REFERENCE NUMERALS

100 . . . Resin Molding Apparatus
W2 . . . Resin Molded Product
14 . . . Resin Injection Portion
141b . . . Protruding Portion
141 . . . Cull Block
19 . . . Unloader (Conveying Apparatus)

20 . . . Holding Component
22 . . . Horizontal Movement Mechanism
23 . . . Vertical Movement Mechanism
21 . . . Base Component
221 . . . Guide Portion
222 . . . Horizontal Drive Portion
231 . . . Guide Portion
232 . . . Vertical Cam Mechanism
222a . . . Slide Component
223 . . . Link Mechanism
224 . . . First Horizontal Cam Mechanism
225 . . . Second Horizontal Cam Mechanism
24 . . . Suction Pads (Mold Release Mechanism)
25 . . . Conveying Claws Best Embodiments for Implementing the Invention Next, the present invention will be described in further detail using examples. It should be noted, however, that the present invention is not limited by the following description.

Figure 15:
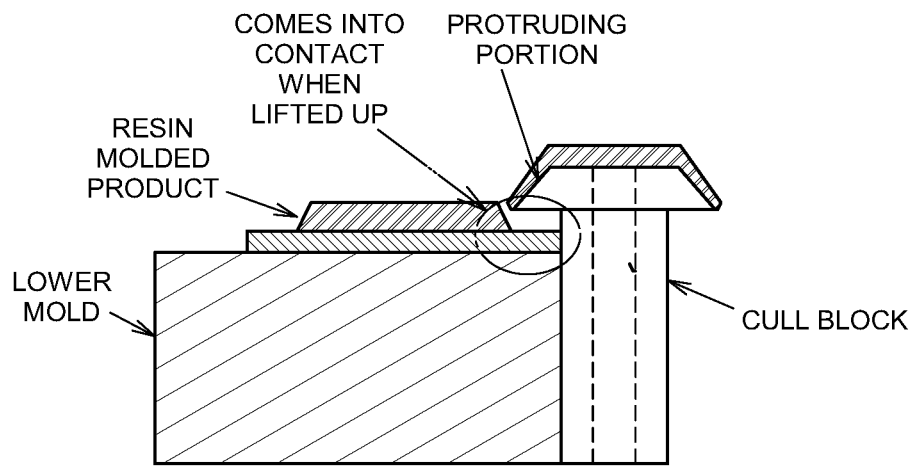
FIG. 15 is a schematic view showing a positional relationship between a resin molded product and a cull block.

As is shown in FIG. 15, in a resin molding apparatus, a cull block in which is formed a pot that contains a resin material may be provided in a lower mold. This cull block protrudes upwards from an upper surface of the lower mold. The cull block also has a protruding portion that protrudes into an upper portion of a substrate that has been placed on the upper surface of the lower mold. In a state in which pot-side end portions of the substrate are sandwiched between the upper surface of the lower mold and a lower surface of the protruding portion, the mold is clamped together. When the mold is in this clamped state, a resin flow path is formed between the upper portion and protruding portion of the cull block and a recessed portion in the upper mold, and resin material is injected into a cavity through this resin flow path. In this resin molding apparatus, the resin material is injected from the upper surface of the substrate by means of this resin flow path.

However, in a case in which a substrate that has been resin molded using this resin molding apparatus is to be lifted up from the lower mold and conveyed away, the substrate comes into contact with the protruding portion of the cull block so that it becomes difficult to perform the conveying-away operation.

As is described above, the conveying apparatus according to the present invention is a conveying apparatus that conveys a resin molded product away from one mold in which a resin injection portion is provided, and is characterized in that the resin injection portion is provided with a component that protrudes between at least a portion of the resin molded product and another mold, and in that the conveying apparatus is provided with a holding component that holds the resin molded product, and a horizontal movement mechanism that moves the holding component which is holding the resin molded product in a horizontal direction so as to move the holding component away from the resin injection portion.

By employing this type of conveying apparatus, because the conveying apparatus includes the horizontal movement mechanism that moves the holding component which is holding the resin molded product in a horizontal direction so as to move the holding component away from the resin injection portion, it is possible, using this conveying apparatus, to convey a resin molded product away from one mold in which is provided a resin injection portion which has a component that protrudes between at least a portion of the resin molded product and another mold.

Moreover, it is desirable that the conveying apparatus be further provided with a vertical movement mechanism that moves the holding component which has been moved by the horizontal movement mechanism in a direction away from the one mold and towards the other mold.

Additionally providing the conveying apparatus with a base component in which the holding component is movably provided may also be considered. As a specific embodiment of the horizontal movement mechanism in this structure, providing the horizontal movement mechanism with a guide portion that guides the holding component away from the resin injection portion, and a horizontal drive portion that causes the holding component to move along the guide portion may also be considered. In addition, as a specific embodiment of the vertical movement mechanism, providing the vertical movement mechanism with a guide portion that guides the holding component in a vertical direction, and a vertical cam mechanism that enables the holding component to move in a vertical direction in conjunction with a horizontal movement of the holding component performed by the horizontal drive portion may also be considered.

If this structure is employed, because the same drive portion can be used to drive both the horizontal movement mechanism and the vertical movement mechanism, not only can a simplification of the structure be achieved, but a reduction in costs also becomes possible.

It is also desirable that the horizontal drive portion include a slide component that slides in a direction towards or in a direction away from the resin injection portion, and that the horizontal movement mechanism be further provided with a link mechanism that enables the holding component to move in a direction away from the resin injection portion in conjunction with a movement of the slide component.

If this structure is employed, because the horizontal movement mechanism includes a link mechanism, a movement of the slide component can be transmitted without any difficulty to a movement of the holding component.

In order to interlink the slide component, the link mechanism, and the holding component irrespectively of their individual movement directions, it is desirable that a first horizontal cam mechanism be provided between the slide component and the link mechanism, and that a second horizontal cam mechanism be provided between the link mechanism and the holding component.

It is also desirable that the conveying apparatus be further provided with a mold release mechanism that releases the resin molded product from the one mold, and that the horizontal movement mechanism move the holding component in a horizontal direction in a state in which the resin molded product has been released from the one mold by the mold release mechanism.

If this structure is employed, then in a case in which the resin molded product is to be moved, because the resin molded product is moved after having been released from the one mold, it is possible to prevent the resin molded product from becoming damaged or broken. In addition, the moving of the resin molded product can be performed smoothly.

In order to hold the resin molded product, providing the holding component with suction pads that suction the resin molded product may also be considered. In this structure, in order to both simplify the structure of the conveying mechanism and additionally enable a reduction in costs to be achieved, it is desirable that the mold release mechanism be formed using suction force from the suction pads.

Forming the conveying apparatus such that the conveying apparatus is additionally provided with conveying claws that hold the resin molded product by grasping it might also be considered. Because using these conveying claws enables a resin molded product to be conveyed more stably, it is possible to inhibit the resin molded product from being dropped.

In this structure, it is desirable that, after the holding component has been moved in a direction away from the one mold towards the other mold using the vertical movement mechanism, the resin molded product be held using the conveying claws.

In a structure that includes these conveying claws, by firstly moving the resin molded product horizontally and then moving it vertically, the resin molded product can be released from the one mold, and a surface on the one mold side of the resin molded product can be held using the conveying claws.

Moreover, by additionally providing the conveying apparatus with a vertical movement mechanism, it becomes possible, without having to provide a releasing component (such as, for example, an ejector pin) in one mold in order for the resin molded product to be released from that one mold, to hold a surface on the one mold side of the resin molded product using the conveying claws.

Moreover, a resin molding apparatus according to the present invention is characterized in including the above-described conveying apparatus.

If this resin molding apparatus is employed, then it is possible, using a conveying apparatus, to convey a resin molded product away from one mold in which is provided a resin injection portion which has a component that protrudes between at least a portion of the resin molded product and another mold.

Furthermore, a conveying method for a resin molded product of the present invention is characterized in that, using the above-described conveying apparatus, a holding component that is holding a resin molded product which has been resin sealed is moved in a horizontal direction by the horizontal movement mechanism so as to move away from the resin injection portion, and the holding component that has been moved away from the resin injection portion is then moved by the vertical movement mechanism in the direction of the other mold and is conveyed out.

In addition to this, a resin molded product manufacturing method according to the present invention is a resin molded product manufacturing method in which an electronic component is resin molded by means of resin molding, and that is provided with a molding step in which resin molding is performed on an object to be molded, and a conveying away step in which a resin molded product that has been resin molded is conveyed away using the above-described conveying apparatus.

If this resin molded product manufacturing method is employed, then it is possible, using a conveying apparatus, to convey a resin molded product away from one mold in which is provided a resin injection portion which includes a component that protrudes between at least a portion of the resin molded product and another mold.

Embodiment of the Present Invention

Hereinafter, an embodiment of a resin molding apparatus according to the present invention will be described with reference to the drawings. Note that each of the drawings shown below has been drawn schematically with omissions or enhancements being employed where appropriate in order to make the drawings easier to understand. In addition, component elements that are mutually the same are given the same descriptive symbols and any duplicated description thereof is omitted.

Overall Structure of a Resin Molding Apparatus

A resin molding apparatus 100 of the present embodiment performs resin molding on an object being molded W1 on which electronic components Wx have been packaged by performing transfer molding thereon using a resin material J.

Here, the object being molded W1 may be, for example, a metal substrate, a resin substrate, a glass substrate, a ceramic substrate, a circuit substrate, a semiconductor substrate, a wiring substrate, or a lead frame or the like, and may either include or not include wiring. The resin material J used for the resin molding may, for example, be a composite material containing a thermosetting resin, and the resin material J may be in granular form, powder form, liquid form, sheet form, or in tablet form or the like. Examples of the electronic components Wx packaged on an upper surface of the object being molded W1 include bare chips and resin sealed chips.

Figure 1:
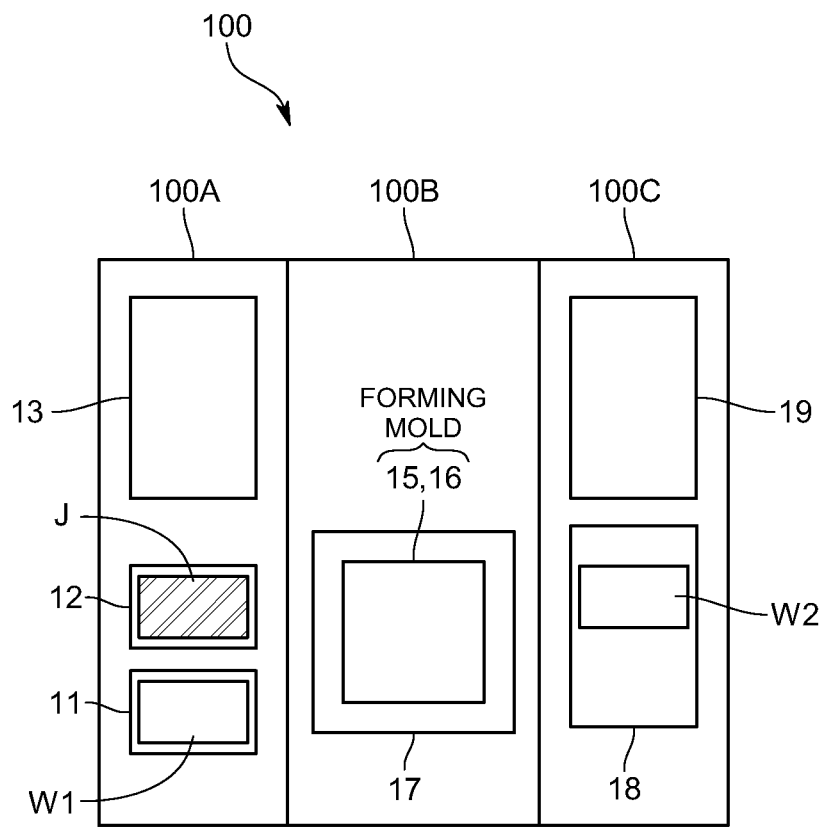
FIG. 1 is a schematic view showing a structure of a resin molding apparatus according to an embodiment of the present invention.

More specifically, as is shown in FIG. 1, the resin molding apparatus 100 is provided with various component elements including a supply module 100A that supplies objects being molded W1 before molding and also the resin material J, a molding module 100B that performs the resin molding, and a storage module 100C that stores objects being molded W2 after the molding (hereinafter, these are referred to as resin molded products W2). Note that each of the supply module 100A, the molding module 100B, and the storage module 100C is able to be combined with or separated from the other component elements, and is also replaceable.

The supply module 100A is provided with an object being molded supply portion 11 that supplies the objects being molded W1, a resin material supply portion 12 that supplies the resin material J, and a conveying apparatus 13 (hereinafter, referred to as a loader 13) that receives the objects being molded W1 from the object being molded supply portion 11 and conveys them to the molding module 100B, and also receives the resin material J from the resin material supply portion 12 and conveys it to the molding module 100B.

The loader 13 moves back and forth between the supply module 100A and the molding module 100B, and performs this by moving along rails (not shown in the drawings) which are provided between the supply module 100A and the molding module 100B.

As is shown in FIG. 2 through FIG. 6, the molding module 100B has one mold 15 (hereinafter, referred to as a lower mold 15) of a forming mold in which a resin injection portion 14 is provided, another mold 16 (hereinafter, referred to as an upper mold 16) of the forming mold which is provided so as to face the lower mold 15 and in which is formed a cavity 16a into which the resin material J is injected, and a mold clamping mechanism 17 that clamps the lower mold 15 and the upper mold 16 together. The lower mold 15 is provided via a lower platen 102 on a movable plate 101 that is raised and lowered by the mold clamping mechanism 17. The upper mold 16 is provided via an upper platen 103 in an upper fixed plate (not shown in the drawings).

The resin injection portion 14 of the present embodiment has a cull block 141 in which is formed a pot 141a that contains the resin material J, a plunger 142 that pumps out the resin material J contained in the pot 141a, and a plunger drive portion 143 that drives the plunger 142. Note that the plunger 142 pumps out the resin material J after this has been heated in the pot 141a so as to become molten.

The cull block 141 is provided in a recessed portion 15M formed in the lower mold 15, and is elastically supported by an elastic component 144 so as to be able to move up and down inside the recessed portion 15M. In addition, a protruding portion 141b that protrudes outwards beyond an aperture of the recessed portion 15M is formed in an upper end portion of the cull block 141. The cull block 141 that includes the protruding portion 141b in this way acts as a component that protrudes between at least a portion of the resin molded product W2 and the upper mold 16.

A cavity 16a that contains the electronic components Wx of the object being molded W1 and into which the molten resin material J is injected is formed in the upper mold 16. In addition, a cull 16b, which is a recessed portion, is formed in a portion of the upper mold 16 that faces the protruding portion 141b of the cull block 141, and a runner 16c that connects the cull 16b to the cavity 16a is also formed in the upper mold 16. Note that, although not shown in the drawings, an air vent is formed in the upper mold 16 on the opposite side from the cull block 141.

Figure 4:
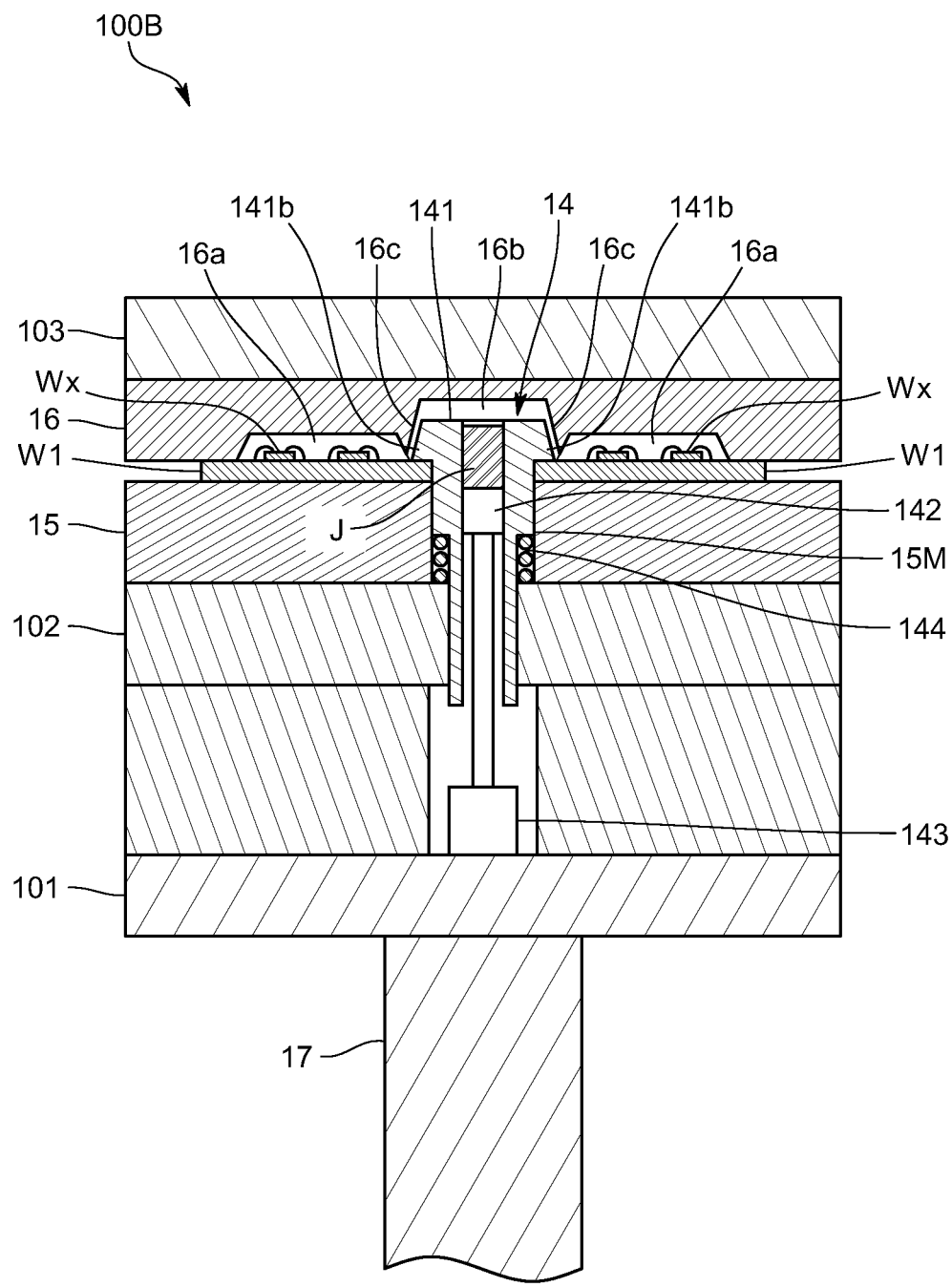
FIG. 4 is a schematic view showing a mold fastened state of the molding module of the same embodiment.

Moreover, as is shown in FIG. 4, when the lower mold 15 and the upper mold 16 are clamped together by the mold clamping mechanism 17, a resin flow path formed by the cull 16b and the runner 16c connects the pot 141a to the cavity 16a. In addition, when the lower mold 15 and the upper mold 16 are clamped together, a pot-side end portion of the object being molded W1 is sandwiched between a lower surface of the protruding portion 141b of the cull block 141 and an upper surface of the lower mold 15. In this state, if the molten resin material J is injected into the cavity 16a by the plunger 142, then the electronic components Wx of the object being molded W1 are resin sealed.

The storage module 100C is provided with a storage portion 18 that stores the resin molded products W2, and a conveying apparatus 19 (hereinafter, referred to as an unloader 19) that receives the resin molded products W2 from the molding module 100B and conveys them to the storage portion 18.

The unloader 19 moves back and forth between the molding module 100B and the storage module 100C, and performs this by moving along rails (not shown in the drawings) provided between the molding module 100B and the storage module 100C. Note that the unloader 19 is described below in detail.

A simple description of basic operations of this resin molding apparatus 100 will now be given with reference to FIG. 2 through FIG. 6.

Figure 2:
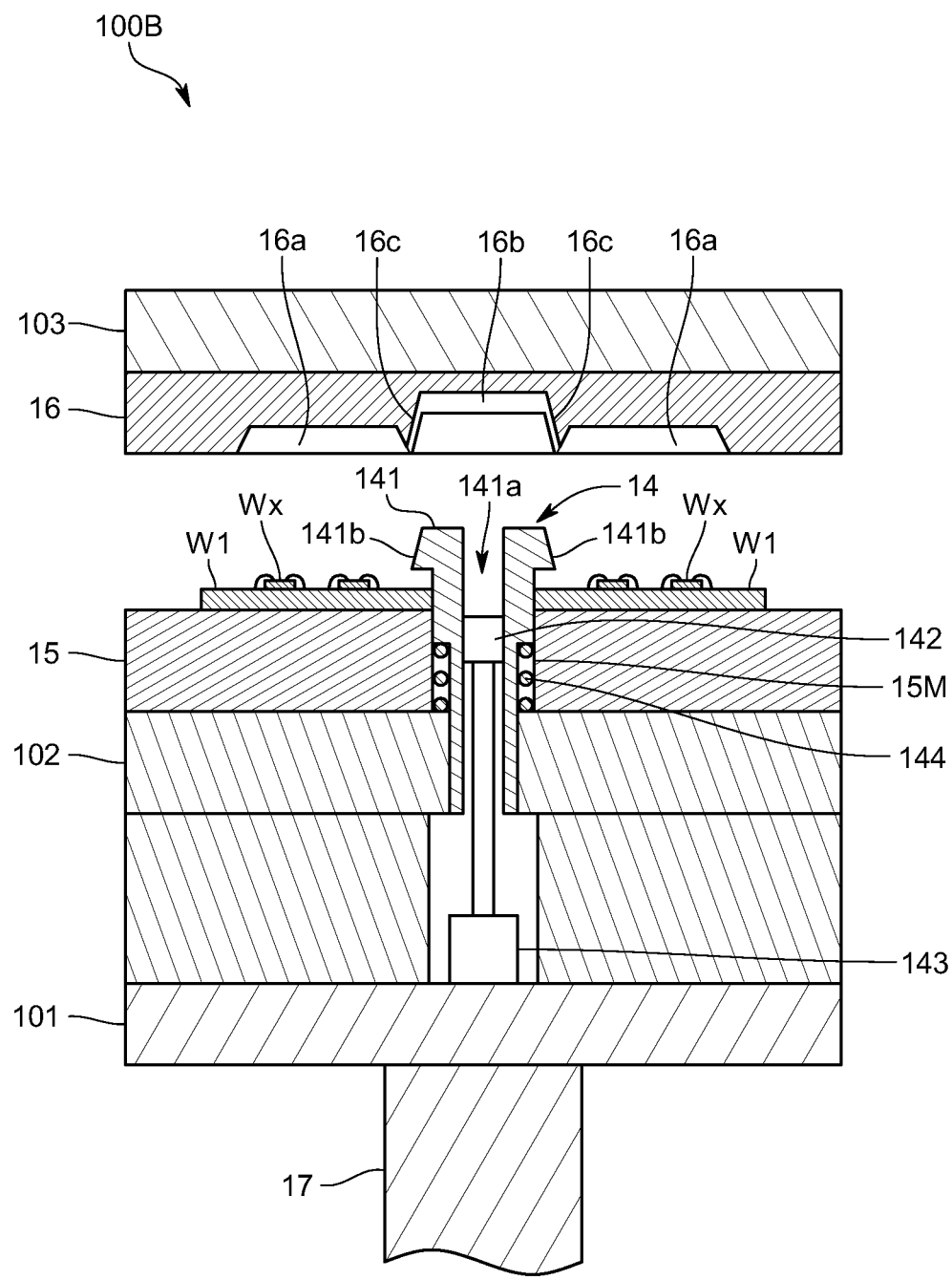
FIG. 2 is a schematic view showing a substrate placement state of a molding module of the same embodiment.
Figure 3:
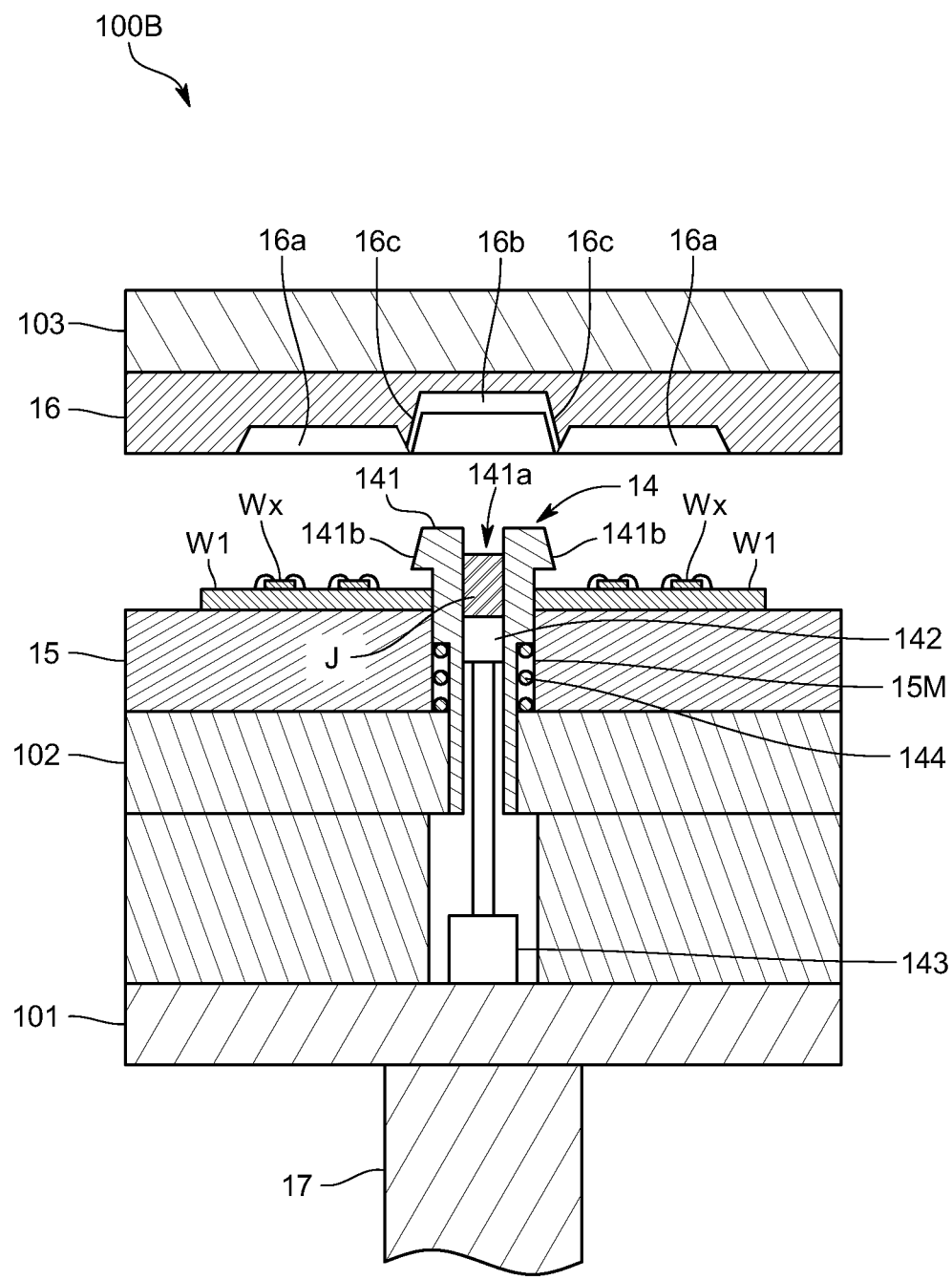
FIG. 3 is a schematic view showing a resin material loaded state of the molding module of the same embodiment.

As is shown in FIG. 2, in a state in which the lower mold 15 and the upper mold 16 are open, an object being molded W1 before molding is conveyed by the loader 13, and is then transferred to the lower mold 15 and placed thereon. At this time, the upper mold 16 and the lower mold 15 have been heated to a temperature that enables the resin material J to be melted and cured. Thereafter, as is shown in FIG. 3, the resin material J is conveyed by the loader 13 and is then held within the pot 141a of the cull block 141.

Figure 5:
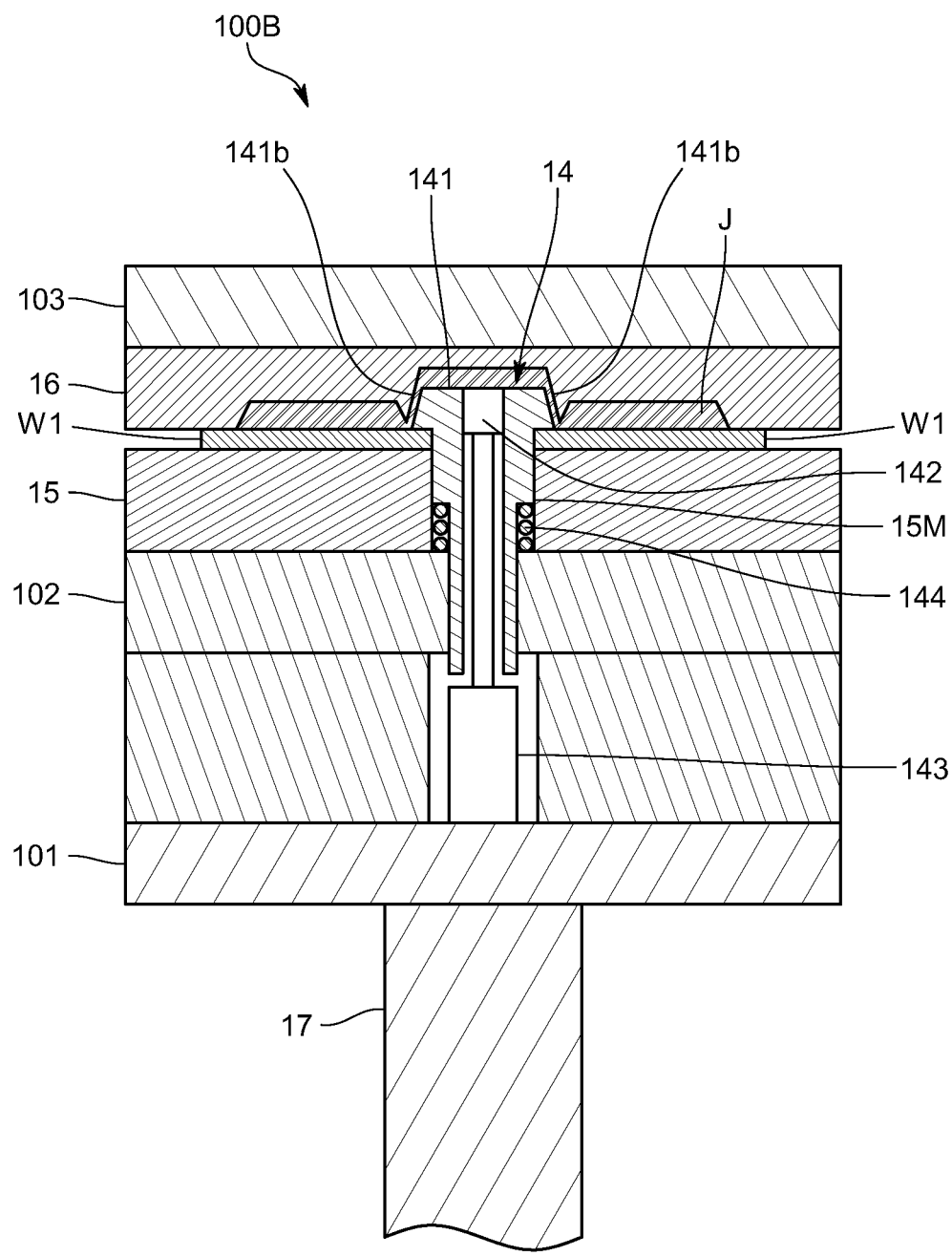
FIG. 5 is a schematic view showing a resin injected state of the molding module of the same embodiment.
Figure 6:
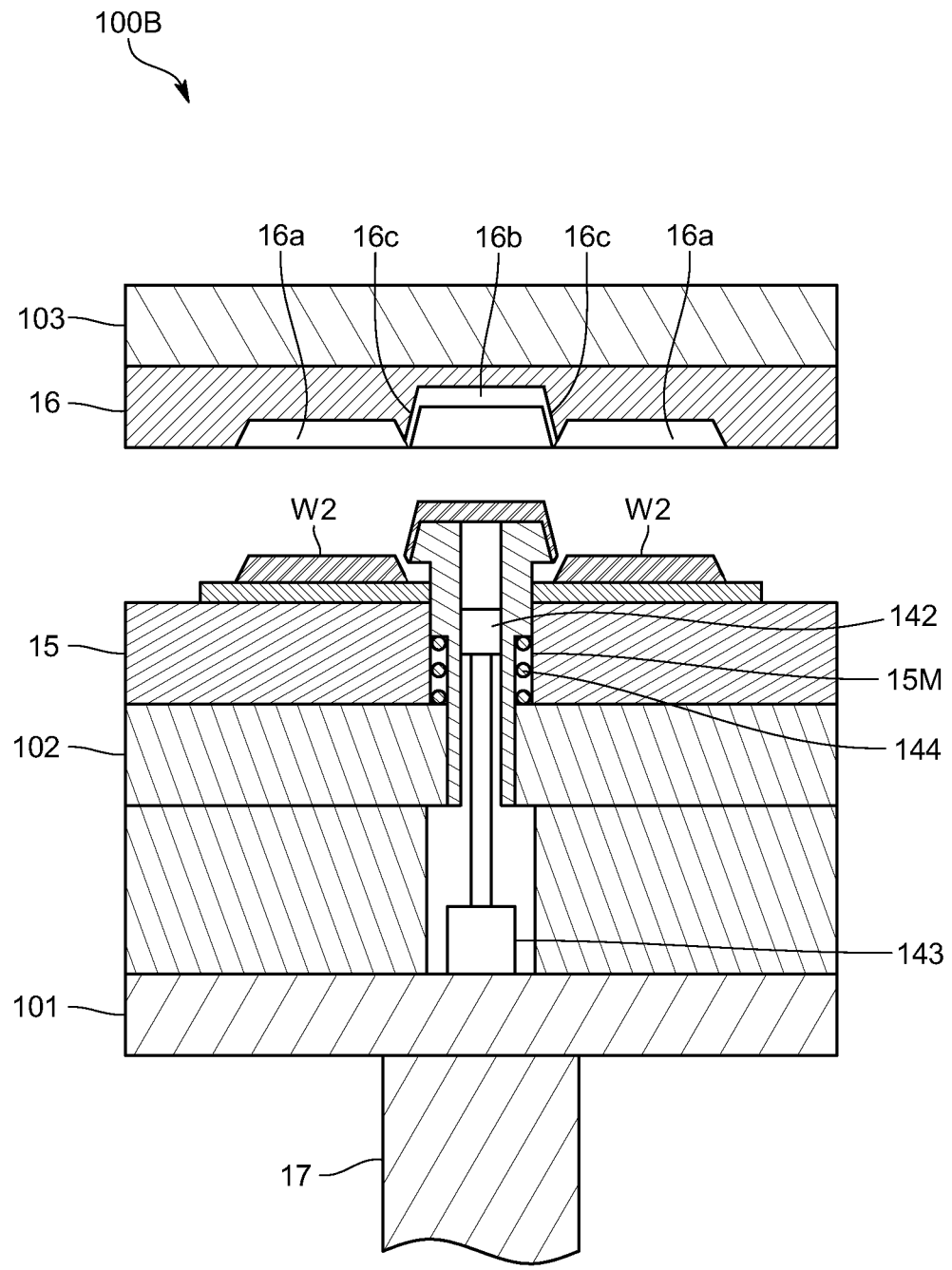
FIG. 6 is a schematic view showing a mold opened state of the molding module of the same embodiment.

If, in this state, the lower mold 15 is raised by the mold clamping mechanism 17, then as is shown in FIG. 4, the cull block 141 hits against the upper mold 16 and is lowered down within the recessed portion 15M of the lower mold 15, so that the lower surface of the protruding portion 141b comes into contact with the pot-side end portion of the object being molded W1. In addition, the lower surface of the upper mold 16 comes into contact with the vent-side end portion of the object being molded W1. As a result, the lower mold 15 and the upper mold 16 are clamped together. Once they are clamped together, if the plunger 142 is then raised by the plunger drive portion 143, then as is shown in FIG. 5, the molten resin material J inside the pot 141a passes through the resin flow path and is injected into the cavity 16a. After the resin material J has subsequently cured inside the cavity 16a, then as is shown in FIG. 6, the mold is opened by the mold fastening mechanism 17, and the resin molded product W2 is conveyed away by the unloader 19, and is transported to the storage portion 18.

Specific Structure of the Unloader 19

Next, the specific structure of the unloader 19 of the present embodiment will be described with reference to FIG. 7 through FIG. 13. Note that, in FIG. 7, FIG. 10, and FIG. 11, conveying claws 25 have been omitted from the drawings.

Figure 7:
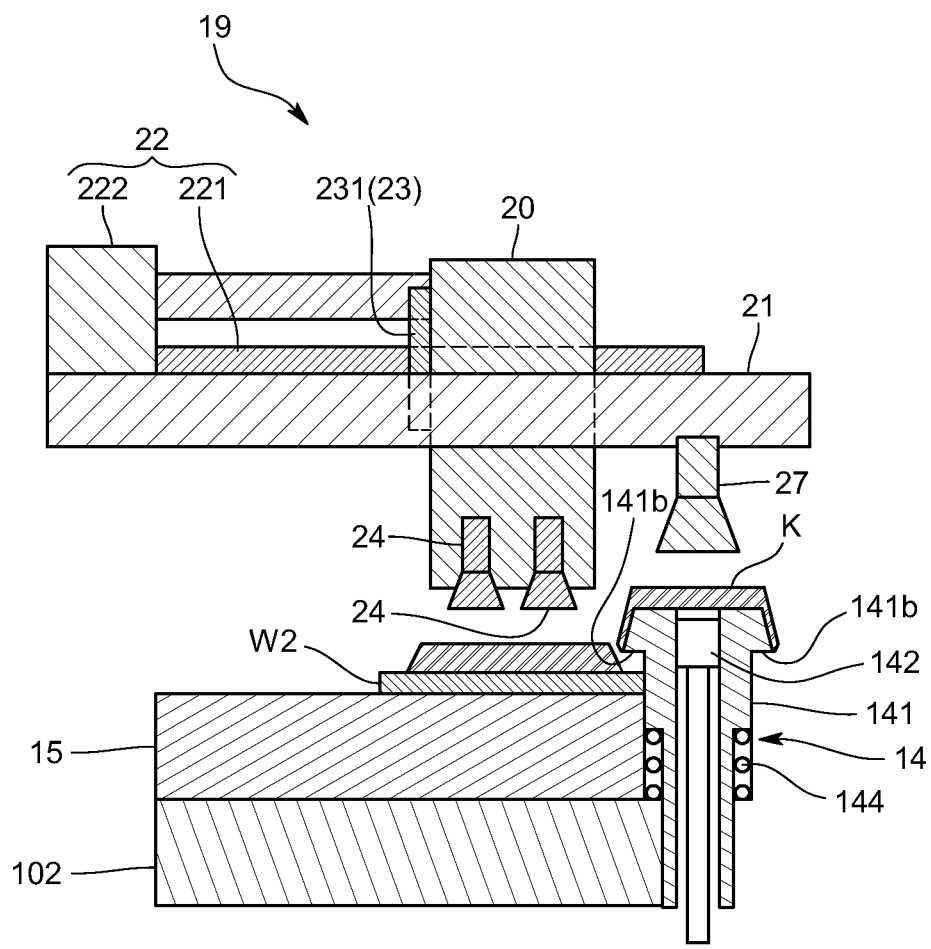
FIG. 7 is a side view schematically showing a state in which the conveying apparatus of the same embodiment is located above a lower mold.

As is shown in FIG. 7 and the like, the unloader 19 is provided with a holding component 20 that holds the resin molded products W2, a base component 21 on which the holding component 21 is movably provided, a horizontal movement mechanism 22 that moves the holding component 20 which is holding the resin molded product W2 in a horizontal direction away from the cull block 141, and a vertical movement mechanism 23 that moves the holding component 20, which has been moved by the horizontal movement mechanism 22, in an upward direction from the lower mold 15 towards the upper mold 16.

The holding component 20 includes suction pads 24 that suction a resin molded product W2 that has been placed on the lower mold 15. The suction pads 24 are provided on a lower surface of the holding component 20, and a suction mechanism (not shown in the drawings) that is used to suction the resin molded product W2 is connected to the suction pads 24. Note that the suction mechanism includes, for example, a suction flow path that is formed within the holding component, and a suction pump that is connected to the suction flow path.

The suction pads 24 of the present embodiment form part of a mold release mechanism that releases the resin molded product W2 from the lower mold 15. When a resin molded product W2 is suctioned by the suction pads 24, the suction pads 24 are elastically deformed by the suction force from the suction pads 24 and the resin molded product W2 is lifted up from the lower mold 15 (see FIG. 11). Note that the amount by which the resin molded product W2 is lifted up by the suction pads 24 is not so great as to cause it to come into contact with the protruding portion 141b of the cull block 141.

The base component 21 is provided so as to be able to move along rails (not shown in the drawings) in a horizontal direction and in a vertical direction. Conveying claws 25 (see FIG. 12-FIG. 14) that are used to prevent a resin molded product W2 that is being held by the holding component 20 from being dropped, or are used to hold a resin molded product W2 are provided on the base component 21. A pair of these conveying claws 25 are provided so as to grasp both end portions of a resin molded product W2, and a distance between the conveying claws 25 is widened or shortened by a drive portion (not shown in the drawings). The resin molded product W2 is able to be grasped as a result of the drive portion shortening the distance between the conveying claws 25, and as a result of this distance between the conveying claws 25 being widened, the resin molded product W2 is able to be moved upwards or downwards by the vertical movement mechanism 23 without being obstructed by the conveying claws 25.

The horizontal movement mechanism 22 moves the holding component 20 which is holding a resin molded product W2 rectilinearly in a direction away from the cull block 141. Note that, as is described above, because the resin molded product W2 is released from the mold by the suction pads 24 of the holding component 20, the horizontal movement mechanism 22 causes a resin molded product W2 released from the mold by the suction pads 24 to move rectilinearly in a direction away from the cull block 141.

More specifically, the horizontal movement mechanism 22 includes a guide portion 221 that guides the holding component 20 in a direction away from the cull block 141, and a horizontal drive portion 222 that moves the holding portion 20 along the guide portion 221.

The guide portion 221 includes rails that are provided extending in a front-rear direction on the base component 21 towards and away from the cull block 141, and a slider that is provided on the holding component 20 and moves along the rails.

Figure 8:
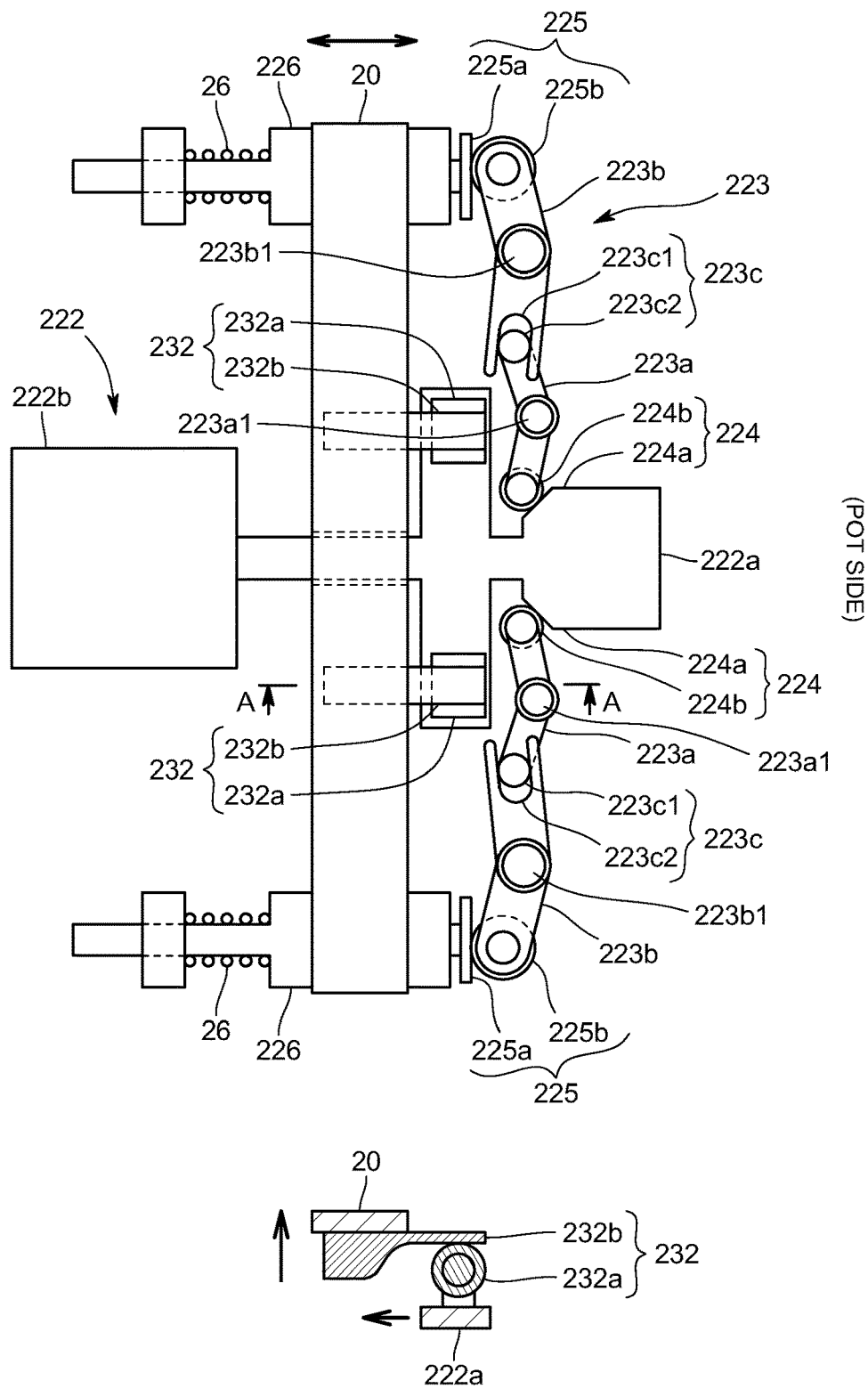
FIG. 8 contains views schematically showing structures of a horizontal movement mechanism and a vertical movement mechanism of the same embodiment.

As is shown in FIG. 8, the horizontal drive portion 222 includes a slide component 222a that slides either in a direction towards or in a direction away from the cull block 141 (i.e., the pot side), and is able to move the slide component 222a using an actuator 222b such as, for example, an air cylinder.

Moreover, as is shown in FIG. 8, the horizontal movement mechanism 22 is additionally provided with a link mechanism 223 that enables the holding component 20 to be moved in a direction away from the cull block 141 in conjunction with a movement of the slide component 222a. The link mechanism 223 of the present embodiment is formed so as to enable the holding component 20 to move in a direction away from the cull block 141 in conjunction with the slide component 222a moving in a direction away from the cull block 141.

More specifically, the link mechanism 223 includes two link arms 223a and 223b, and the first link arm 223a is provided closer to the slide component 222a side than the second link arm 223b. Each of the link arms 223a and 223b is able to rotate around rotation shafts 223a1 and 223b1 that are provided on the base component 21. An interlink portion 223c between the first link arm 223a and the second link arm 223b is formed by a slide hole 223c1 that is provided in the one link arm 223b, and a pin 223c2 that is provided on the other link arm 223a and slides inside the slide hole 223c1. As a result, in conjunction with a rotation of the first link arm 223a, the second link arm 223b is rotated in an opposite direction from the rotation direction of the first link arm 223a.

Furthermore, as is shown in FIG. 8, in the horizontal movement mechanism 22, a first horizontal cam mechanism 224 is provided between the slide component 222a and the link mechanism 223, and a second horizontal cam mechanism 225 is provided between the link mechanism 223 and the holding component 20.

The first horizontal cam mechanism 224 includes a first roller contact portion 224a that is provided in the slide component 222a, and a first roller component 224b that is provided on the first link arm 223a and that moves in conjunction with a movement of the first roller contact portion 224a. The first roller contact portion 224a of the present embodiment is formed by an inclined surface and a flat surface that are formed on a side surface of the slide component 222a, and is formed such that the first roller component 224b slides over this inclined surface and flat surface. As a result of the first roller component 224b moving over the inclined surface of the first roller contact portion 224a, the first link arm 223a is rotated in one direction (see FIG. 9 (b)). In contrast, as a result of the first roller component 224b moving over the flat surface of the first roller contact portion 224a, the first link arm 223a is maintained in its existing state without being rotated (see FIG. 9 (c)). The first roller component 224b of the present embodiment may also be formed, for example, using rolling bodies (i.e., bearings) and bushes that are rotatably provided on an inner side end portion of the first link arm 223a. As a result, the movement of the first horizontal cam mechanism 224 (i.e., the rotation of the roller component 224b) is able to proceed smoothly.

The second horizontal cam mechanism 225 includes a second roller contact portion 225a that is provided in the holding component 20, and a second roller component 225b that is provided on the second link arm 223b and that moves in conjunction with a movement of the second roller contact portion 225a. The second roller component 225b of the present embodiment may also be formed, for example, using rolling bodies (i.e., bearings) and bushes that are rotatably provided on an outer side end portion of the second link arm 223b. As a result, the movement of the second horizontal cam mechanism 225 (i.e., the rotation of the roller component 225b) is able to proceed smoothly. In addition, the second roller contact portion 225a is provided on a surface of the holding component 20 that faces toward the cull block 141 side, and is formed as a flat surface in the present embodiment.

Figure 9:
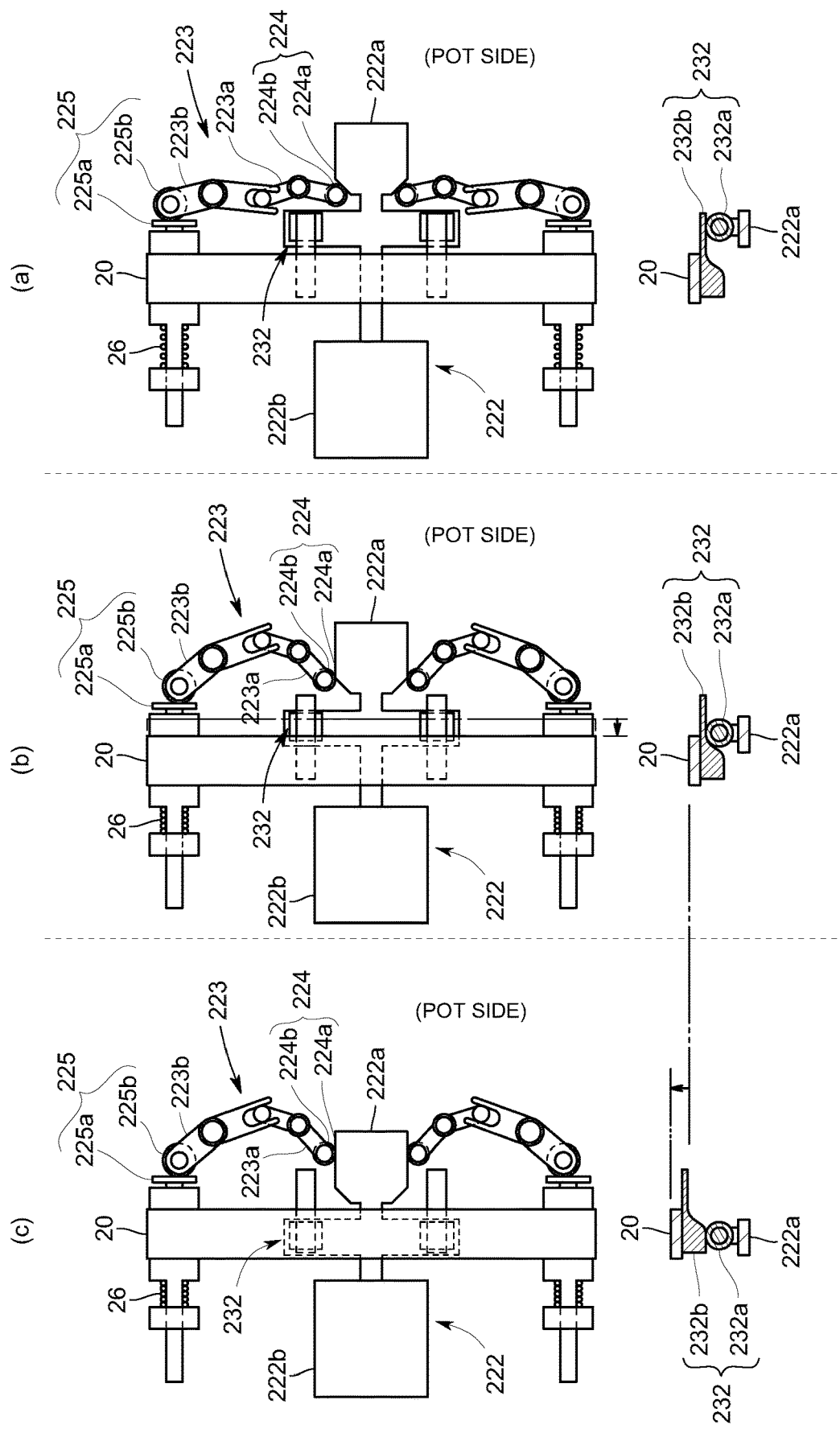
FIG. 9 contains views schematically showing operations of the horizontal movement mechanism and the vertical movement mechanism of the same embodiment.

By employing this type of link mechanism 223, if the horizontal drive portion 222 moves the slide component 222a in a direction away from the cull block 141 (i.e., from FIG. 9 (a) to FIG. 9 (b)), then the first roller component 224b moves along the inclined surface of the first roller contact portion 224a of the slide component 222a, and the first link arm 223a is rotated. In conjunction with this rotation of the first link arm 223a, the second link arm 223b is rotated in the opposite direction from the rotation direction of the first link arm 223a, and the second roller component 225b of the second link arm 223b pushes the second roller contact portion 225a in a direction away from the cull block 141. As a result of this, the holding component 20 is moved in a direction away from the cull block 141. Thereafter, when the first roller component 224b reaches the flat surface of the first roller contact portion 224a (i.e., from FIG. 9 (b) to FIG. 9 (c)), the rotation of the first link arm 223a is stopped, and the movement of the holding component 20 in a horizontal direction is also stopped.

Note that the holding component 20 is urged towards the cull block 141 side, for example, by an elastic component 26 that is provided via a T-shaped block 226, and when the slide component 222a is moved by the horizontal drive portion 222 towards the cull block 141, the holding portion 20 is also moved towards the cull block 141.

The vertical movement mechanism 23 enables the holding component 20 which has been moved by the horizontal movement mechanism 22 to be moved rectilinearly in a vertical direction. Note that when this movement is being performed by the vertical movement mechanism, the resin molded product W2 is positioned on an outer side of the protruding portion 141b of the cull block 141.

More specifically, the vertical movement mechanism 23 includes a guide portion 231 (see FIG. 7) that guides the holding component 20 in a vertical direction (i.e., in an up-down direction), and a vertical cam mechanism 232 (see FIG. 8) that enables the holding component 20 to be moved in a vertical direction in conjunction with the horizontal movement of the holding component 20 that is performed by the horizontal drive portion 222.

The guide portion 231 includes rails that are provided extending in an up-down direction on the base component 21, and a slider that is provided on the holding component 20 and that moves along the rails.

As is shown in FIG. 8, the vertical cam mechanism 232 includes a vertical movement roller component 232a that is provided in the slide component 222a, and a vertical movement roller contact portion 232b that is provided in the holding component 20 and is moved in conjunction with a movement of the vertical movement roller component 232a. The vertical movement roller component 232a of the present embodiment moves together with the slide component 222a. In addition, the vertical movement roller contact portion 232b has an inclined surface that causes the vertical movement roller contact portion 232b to move in an upward direction in conjunction with the movement of the vertical movement roller component 232a in a direction way from the cull block 141.

When the horizontal drive portion 222 moves the slide component 222a in a direction away from the cull block 141 using this vertical movement mechanism 23 (i.e., from FIG. 9 (b) to FIG. 9 (c)), the vertical movement roller component 232a moves in a direction away from the cull block 141, and the vertical movement roller contact portion 232b moves in an upward direction (see FIG. 9 (c)). As a result, the holding component 20 is moved in an upward direction.

Note that, when the slide component 222a is moved towards the cull block 141 by the horizontal drive portion 222, the holding component 20 is moved by its own weight in a downward direction along the guide portion 231 (see FIG. 9 (b)).

Operations of the Unloader 19

Next, conveying operations performed by the unloader 19 will be described with reference to FIG. 7, and FIG. 10 through FIG. 14.

Figure 10:
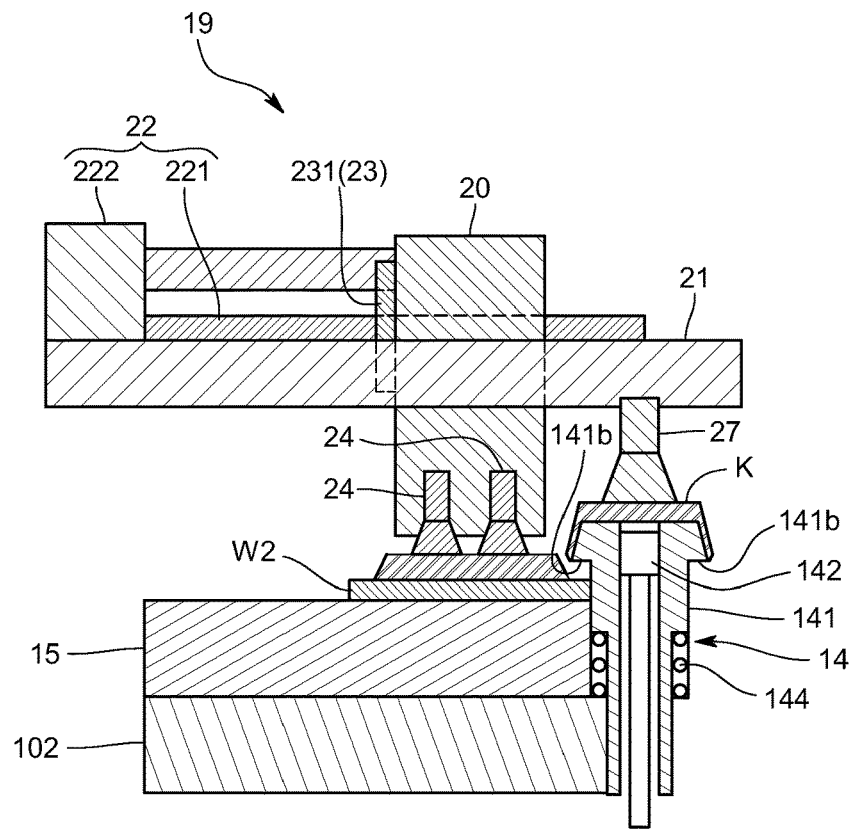
FIG. 10 is a side view schematically showing a state in which the conveying apparatus of the same embodiment is in a predetermined holding position.
Figure 11:
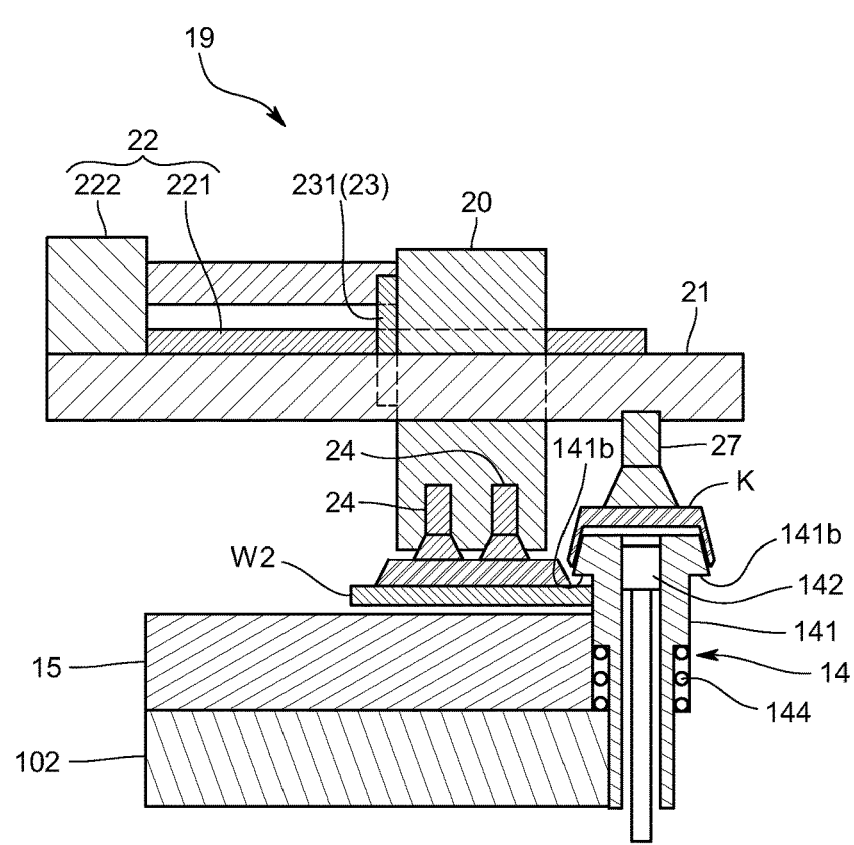
FIG. 11 is a side view schematically showing a state in which the conveying apparatus of the same embodiment is holding a resin molded product using suction.

Firstly, as is shown in FIG. 7, after the unloader 19 has been moved to above the lower mold 15, as is shown in FIG. 10, the resin molded product W2 is lowered to a predetermined position in order to be held via suction. Next, as is shown in FIG. 11, the resin molded product W2 is held by suction provided by the suction pads 24 of the holding component 20. Note that, although not shown in FIG. 11, the distance between the conveying claws 25 has been widened in order that the conveying claws 25 do not obstruct the holding via suction of the resin molded product W2. In addition, a suction pad 27 that is used to suction excess resin K remaining on the upper surface of the cull block 141 is provided in the base component 21, and this suction pad 27 suctions and holds excess resin K. Here, as is shown in FIG. 11, the resin molded product W2 is released from the lower mold 15 simultaneously with the resin molded product W2 being held via suction by the suction pads 24 of the holding component 20.

Figure 12:
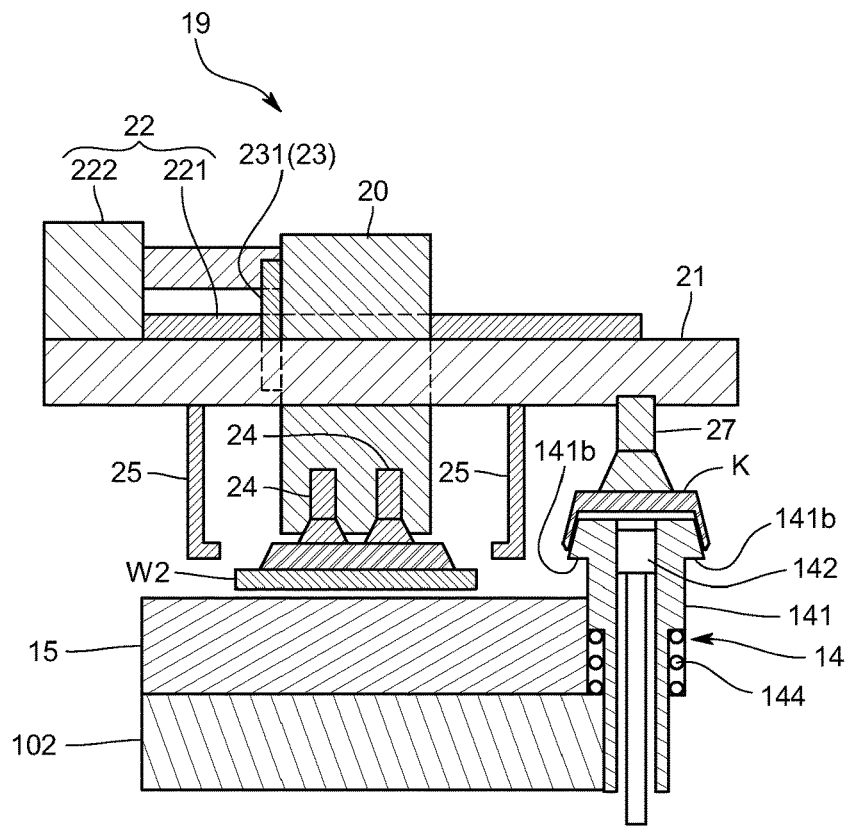
FIG. 12 is a side view schematically showing a state in which the conveying apparatus of the same embodiment is moving a resin molded product using the horizontal movement mechanism.

Next, as is shown in FIG. 12, the holding component 20 is moved by the horizontal movement mechanism 22 in a direction away from the cull block 141. More specifically, when slide component 222a is moved in an away direction by the horizontal drive portion 222 (see FIG. 9 (b)), the holding component 20 is moved in a direction away from the cull block 141 by the link mechanism 223 and the horizontal cam mechanisms 224 and 225. As a result of this movement, the resin molded product W2 is moved to the outer side of the protruding portion 141b of the cull block 141.

Figure 13:
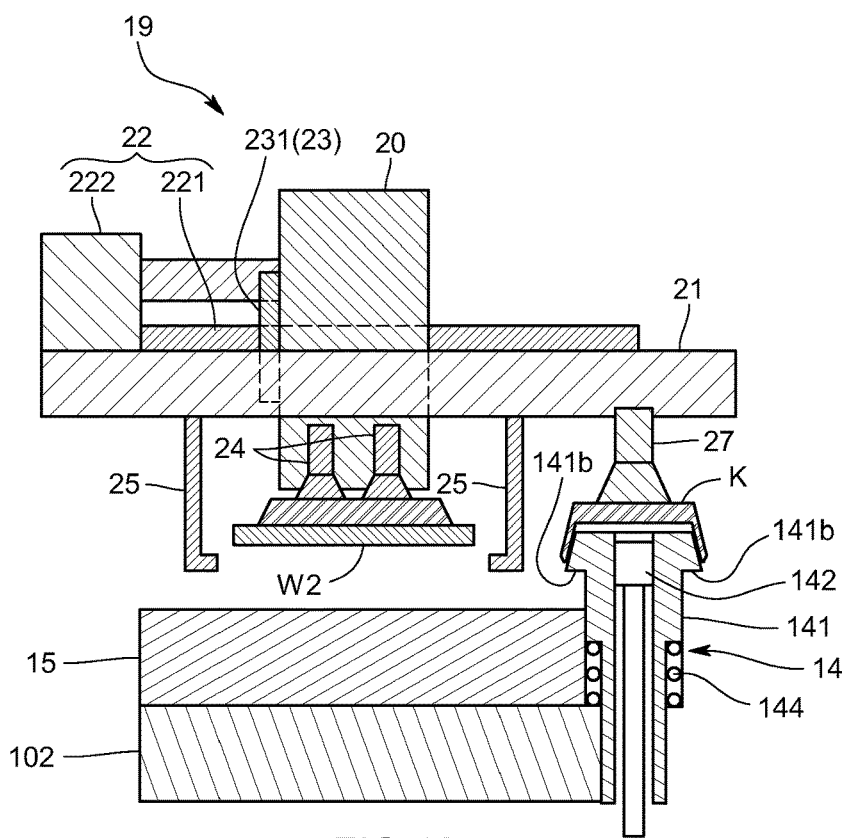
FIG. 13 is a side view schematically showing a state in which the conveying apparatus of the same embodiment is lifting up a resin molded product using the vertical movement mechanism.

Moreover, as is shown in FIG. 13, when the holding component 20 is moved by the horizontal movement mechanism 22, the holding component 20 is lifted up in conjunction with this movement. More specifically, when the slide component 222a is moved in an away direction by the horizontal drive portion 222 (see FIG. 9 (c)), the holding component 20 is moved in an upward direction by the vertical cam mechanism 232. As a result of this movement, the resin molded product W2 is moved to a height at which it is able to be held by the conveying claws 25.

Figure 14:
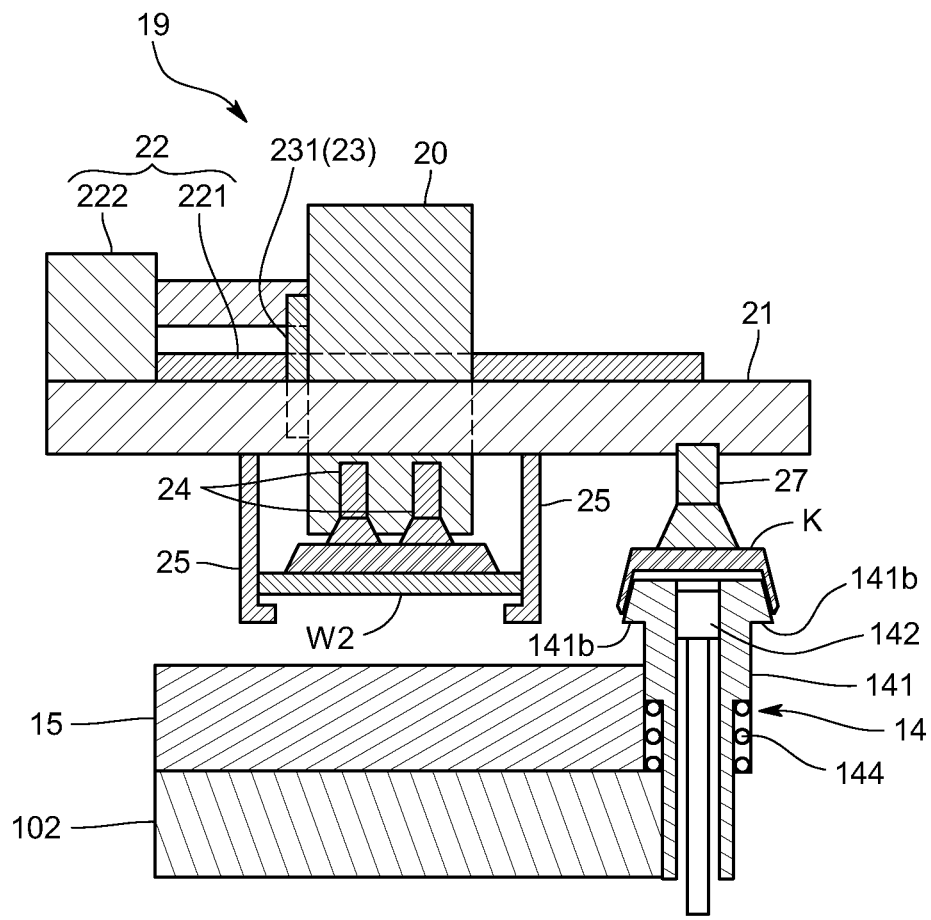
FIG. 14 is a side view schematically showing a state in which a distance between conveying claws has been shortened in the conveying apparatus of the same embodiment.

Thereafter, as is shown in FIG. 14, the distance between the conveying claws 25 is shortened, so that the conveying claws 25 are positioned underneath the resin molded product W2. In this state, the unloader 19 conveys the resin molded product W2 that is being held to the storage portion 18 of the storage module 100C.

Effects of the Present Embodiment

According to the resin molding apparatus 100 of the present embodiment, because the unloader 19 includes the horizontal movement mechanism 22 that moves the holding component 20 which is holding a resin molded product W2 in a horizontal direction so as to move it away from the cull block 141, the resin molded product W2 can be conveyed by the unloader 19 away from the lower mold 15 in which is provided the cull block 141 which includes the protruding portion 141b which protrudes above the resin molded product W2.

Additional Variant Embodiments

Note that the present invention is not limited to the above-described embodiment.

For example, in the above-described embodiment a structure is employed in which the vertical movement mechanism 23 uses the horizontal drive portion 222 of the horizontal movement mechanism 22, however, it is also possible to provide a drive portion for the vertical movement mechanism 23 that is different from the horizontal drive portion 222 of the horizontal movement mechanism 22.

Moreover, in the above-described embodiment, a structure is employed in which the mold release mechanism uses the suction pads 24, however, it is possible to instead employ a structure in which mold release is achieved by moving the holding component 20 which is holding a resin molded product W2 in an upward direction, or a structure in which mold release is achieved by moving the conveying apparatus 19 itself in an upward direction. Note that a mold release mechanism is not an indispensable part of the structure, and it is also possible to employ a structure in which the resin molded product W2 is moved horizontally while in a state of contact with the lower mold 15.

Furthermore, in the above-described embodiment, a structure is employed in which the holding component 20 is moved in a direction away from the cull block 141 as a result of the slide component 222a being moved by the horizontal drive portion 222 in a direction away from the cull bock 141, however, it is also possible to employ a structure in which the holding component 20 is moved in a direction away from the cull block 141 as a result of the slide component 222a being moved by the horizontal drive portion 222 in a direction toward the cull bock 141. In this case, consideration may be given, for example, to forming the link mechanism 223 using a single link arm (for example, the first link arm 223a of the above-described embodiment).

In the above-described embodiment, the conveying claws 25 are used to prevent the resin molded product W2 which is being held using suction from being dropped, however, it is also possible to employ a structure in which, after a resin molded product W2 has been lifted up, the holding via suction is released, and the resin molded product W2 is then held by the conveying claws 25. Moreover, if a structure is employed in which a resin molded product W2 is held via suction while being transported, then this structure negates the need for the conveying claws 25 to be provided.

In the above-described embodiment, a structure is employed in which the cull block 141 is provided in the lower mold 15, however, it is also possible to employ a structure in which the cull block 141 is provided in the upper mold 16. In this case, in the same type of operation as is performed in the above-described embodiment, a resin molded product W2 is transported away from the upper mold 16 by the unloader 19.

The resin molding apparatus of the present invention is not limited to being used in transfer molding, and may also be used, for example, in compression molding.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

INDUSTRIAL APPLICABILITY

According to the present invention, it is possible for a resin molded product to be conveyed by a conveying apparatus away from one mold in which is provided a resin injection portion which has a component that protrudes between at least a portion of the resin molded product and another mold.

What is claimed is:

1. A conveying apparatus that conveys a resin molded product away from one mold in which a resin injection portion is provided, wherein the resin injection portion comprises a component that protrudes between at least a portion of the resin molded product and an other mold, the conveying apparatus comprising:
a holding component that holds the resin molded product;
a base component in which the holding component is movably provided;
a horizontal movement mechanism that moves the holding component which is holding the resin molded product in a horizontal direction so as to move the holding component away from the resin injection portion, wherein the horizontal movement mechanism comprises a guide mechanism that guides the holding component in a direction away from the resin injection portion, and a horizontal drive portion that causes the holding component to move along the guide mechanism, wherein the horizontal drive portion comprises a slide component that slides in a direction towards or in a direction away from the resin injection portion, and wherein the horizontal movement mechanism further comprises a link mechanism that enables the holding component to move in a direction away from the resin injection portion in conjunction with a movement of the slide component, wherein a first horizontal cam mechanism is provided between the slide component and the link mechanism, and a second horizontal cam mechanism is provided between the link mechanism and the holding component; and
a vertical movement mechanism that moves the holding component which has been moved by the horizontal movement mechanism in a direction away from the one mold and towards the other mold, wherein the vertical movement mechanism comprises a guide mechanism that guides the holding component in a vertical direction, and a vertical cam mechanism that enables the holding component to move in the vertical direction in conjunction with horizontal movement of the holding component performed by the horizontal drive portion.

2. The conveying apparatus according to claim 1, wherein the conveying apparatus further comprises a mold release mechanism that releases the resin molded product from the one mold, and
the horizontal movement mechanism moves the holding component in a horizontal direction in a state in which the resin molded product has been released from the one mold by the mold release mechanism.

3. The conveying apparatus according to claim 2, wherein the holding component comprises suction pads that suction the resin molded product, and
the mold release mechanism is formed using suction force from the suction pads.

4. The conveying apparatus according to claim 1, further comprising conveying claws that hold the resin molded product by grasping it, and after the holding component has been moved in a direction away from the one mold towards the other mold using the vertical movement mechanism, the resin molded product is held using the conveying claws.

5. A resin molding apparatus comprising the conveying apparatus according to claim 1.

6. A conveying method for a resin molded product the employs the conveying apparatus according to claim 1, in which the holding component that is holding a resin molded product which has been resin molded is moved in a horizontal direction by the horizontal movement mechanism so as to move away from the resin injection portion, and the holding component that has been moved away from the resin injection portion is then moved by a vertical movement mechanism in a direction of the other mold.

7. A resin molded product manufacturing method in which an electronic component is resin molded via resin molding, comprising:
a molding step in which resin molding is performed on an object to be molded; and
a conveying away step in which a resin molded product that has been resin molded is conveyed away using the conveying apparatus according to claim 1.

* * * * *